US008667045B1

United States Patent
Langhammer

(10) Patent No.: US 8,667,045 B1
(45) Date of Patent: Mar. 4, 2014

(54) GENERALIZED PARALLEL COUNTER STRUCTURES IN LOGIC DEVICES

(75) Inventor: Martin Langhammer, Alderbury (GB)

(73) Assignee: Altera Corporation, San Jose, CA (US)

( * ) Notice: Subject to any disclaimer, the term of this patent is extended or adjusted under 35 U.S.C. 154(b) by 461 days.

(21) Appl. No.: 13/105,133

(22) Filed: May 11, 2011

(51) Int. Cl.
*G06F 7/50* (2006.01)
(52) U.S. Cl.
USPC .......................................................... 708/672
(58) Field of Classification Search
None
See application file for complete search history.

(56) References Cited

U.S. PATENT DOCUMENTS

| 4,837,791 A * | 6/1989 | Nakanishi et al. ............... 377/49 |
| 5,274,581 A * | 12/1993 | Cliff et al. ...................... 708/700 |
| 5,504,698 A | 4/1996 | Su .................................. 708/670 |
| 6,434,588 B1 * | 8/2002 | Kim et al. ...................... 708/672 |
| 7,260,595 B2 * | 8/2007 | Talwar et al. .................. 708/712 |
| 7,565,388 B1 * | 7/2009 | Baeckler et al. ............... 708/235 |
| 8,482,312 B1 * | 7/2013 | Langhammer ................... 326/38 |
| 2009/0216826 A1 | 8/2009 | Brisk et al. |

OTHER PUBLICATIONS

Matsunaga, T., et al., "Multi-Operand Adder Synthesis on FPGAs using Generalized Parallel Counters," http://www.c.csce.kyushi-u.ac.jp/lab_db/papers/paper/pdf/2009/taeko09_1.pdf (2009).
Veeramachaneni, S., et al., "Novel Architectures for Efficient (m,n) Parallel Counters," *GLSVLSI'07* (Mar. 11-13, 2007), pp. 188-191.

* cited by examiner

*Primary Examiner* — David H Malzahn
(74) *Attorney, Agent, or Firm* — Ropes & Gray LLP; Jeffrey H. Ingerman

(57) ABSTRACT

Generalized parallel counter circuitry is configured from logic elements—e.g., on a programmable integrated circuit device. Each logic element includes a logic stage, an adder and an output stage. The logic stage includes logic units, and a logic stage selector for selectively outputting to an input of the adder at least one of (a) outputs of the logic units, and (b) a first logic unit output of another one of the logic elements, and for selectively outputting to the output stage one of (a) an output of the logic units, and (b) a first output of the adder. The output stage includes at least two outputs, an output selector for selectively outputting, to the at least two outputs, at least one of (a) a second output of the adder, and (b) an output of the logic stage selector.

26 Claims, 5 Drawing Sheets

US 8,667,045 B1

GENERALIZED PARALLEL COUNTER STRUCTURES IN LOGIC DEVICES

FIELD OF THE INVENTION

This invention relates to logic structures for efficient implementation of generalized parallel counters (GPCs) in integrated circuit devices, and particularly in programmable logic devices (PLDs) such as field-programmable gate arrays (FPGAs).

BACKGROUND OF THE INVENTION

Many integrated circuit devices support arithmetic operations including addition. In some forms of integrated circuit devices, ripple-carry adders are an efficient form of adder. However, in other forms of integrated circuit devices, particularly PLDs such as FPGAs, ripple-carry adders may not be practical because they do not map well onto available routing structures. An alternative form of adder that is compatible with PLD routing constraints includes a carry-save adder or compressor. However, carry-save adders/compressors require up to twice the logic of ripple-carry adders, which can be a significant burden when implementing multipliers.

SUMMARY OF THE INVENTION

The present invention relates to a modified ternary adder structure that can be used to implement more efficient GPC-based adders. Because some of the logic elements used to implement a ternary-adder-based GPC are used only to output results carried from another logic element, and similarly some logic elements are used only to perform computations but not to output results, by slightly altering the logic elements they can be interconnected in a way that eliminates some or all of the unused portions.

Therefore, in accordance with the present invention, there is provided a logic element for a programmable integrated circuit device. The logic element includes a logic stage, an adder and an output stage. The logic stage includes logic units, and a logic stage selector for selectively outputting to an input of the adder at least one of (a) outputs of the logic units, and (b) a first logic unit output of another one of the logic elements, and for selectively outputting to the output stage one of (a) an output of the logic units, and (b) a first output of the adder. The output stage includes at least two outputs, an output selector for selectively outputting, to the at least two outputs, at least one of (a) a second output of the adder, and (b) an output of the logic stage selector.

Generalized parallel counter circuitry configured from such logic elements, a method of operating such circuitry, and a machine-readable data storage medium encoded with software for configuring a programmable logic device as such circuitry, are also provided.

BRIEF DESCRIPTION OF THE DRAWINGS

Further features of the invention, its nature and various advantages will be apparent upon consideration of the following detailed description, taken in conjunction with the accompanying drawings, in which like reference characters refer to like parts throughout, and in which.

DETAILED DESCRIPTION OF THE INVENTION

Figure 1:
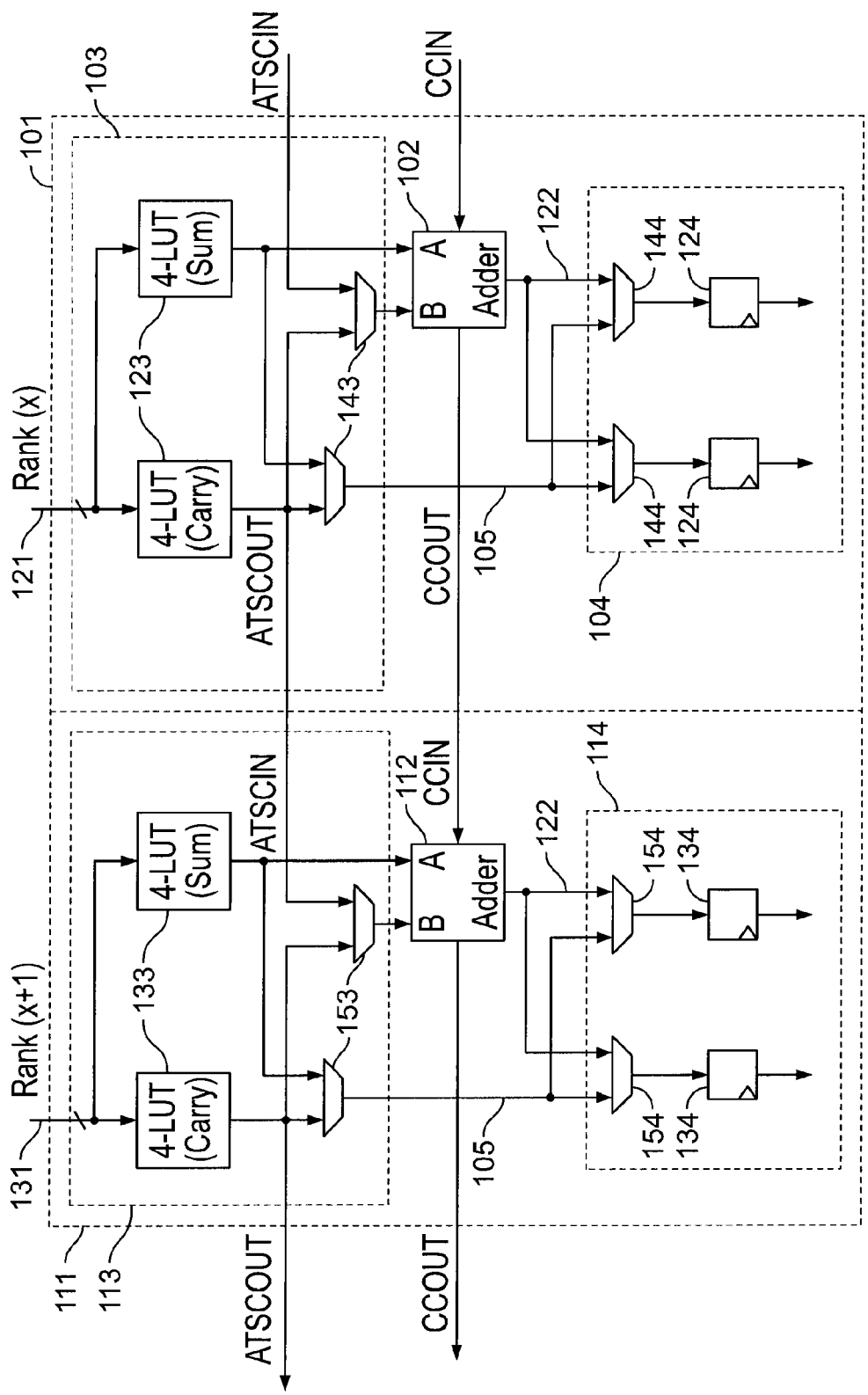
FIG. 1 shows one embodiment of logic element structures that may be configured as ternary adders for use in a GPC implementation.

As discussed above, a commonly used form of arithmetic term compression in integrated circuit devices is a compressor (i.e., a carry-save adder). Some circuit designs cannot be implemented in, e.g., an FPGA using ripple-carry adders because the routing constraints due to placement constraints for the ripple-carry adder tree are substantial. On the other hand, the lack of horizontal carries in compressors makes for easier fitting of the adder tree in an FPGA, allowing large reduction structures to fill the device. However, compressors are inefficient in programmable devices such as PLDs and particularly FPGAs, because the amount of logic required for a given reduction ratio can be twice that of using a ripple-carry adder tree.

A generalized parallel counter (GPC) can function as a carry-save adder/compressor. A GPC can have multiple ranks, and depending on the rank (i.e., the column of a multi-operand number system), the GPC will be more or less efficient as an adder, with between 20% and 100% wasted logic at the beginning and the end of the GPC.

Commonly-assigned U.S. Pat. No. 7,656,388, which is hereby incorporated by reference herein in its entirety, describes a ternary adder structure that may be provided in PLDs such as FPGAs. For example, the logic elements of FPGAs in the STRATIX® family of devices available from Altera Corporation, of San Jose, Calif., incorporate such ternary adders. It has been found that such ternary adders can be used to implement scalable multi-rank GPCs—e.g., (3,3,3;5), (3,3,3,3;6), (3,3,3,3,3;7), (3,3,3,3,3,3;8)—where (3,3,3;5) denotes three 3-bit inputs and a 5-bit output, (3,3,3,3;6) denotes four 3-bit inputs and a 6-bit output, and so on. Generally, for example, (3,3,3,3,3;7) is a 5-rank addition or compression, while (3,4,5;5) is a 3-rank operation.

As the number of ranks grows, a ternary GPC implemented with ternary adders, such as in an FPGA in the aforementioned STRATIX® family of devices, becomes more efficient in terms of logic. The number of logic elements used is two greater than the total number of ranks in the GPC—which is the "wasted logic" referred to above. For example, an 8-rank GPC will use ten logic elements. The compression ratio of the GPC approaches that of the ternary adder as the number of ranks increase, although delay also grows as the number of ranks increases. Sometimes smaller rank GPCs will therefore be required to increase system performance, or where there is a small number of bits at one level remaining to compress. Delay can be reduced by using smaller GPCs, but then efficiency decreases. For example, a 3-rank GPC will use five logic elements, which is 40% less efficient than ternary addition, which uses only three logic elements.

In accordance with embodiments of the present invention, logic elements may be altered to allow implementation of modified ternary adders that can be used to form GPCs that may be up to 100% efficient as compared with ternary addition.

Table 1, below, shows an implementation of a system of GPCs each having four 3-bit inputs and 6-bit output—i.e., a system of (3,3,3,3;6) GPCs:

TABLE 1

| C* |    |     | B*  | B*  | B*  | B*  |    |     | A*  | A*  | A*  | A*  |
|----|----|-----|-----|-----|-----|-----|----|-----|-----|-----|-----|-----|
| C* |    |     | B*  | B*  | B*  | B*  |    |     | A*  | A*  | A*  | A*  |
| C* |    |     | B*  | B*  | B*  | B*  |    |     | A*  | A*  | A*  | A*  |
| SC1|    |     | SB4 | SB3 | SB2 | SB1 |    |     | SA4 | SA3 | SA2 | SA1 |
|    |    | CB4 | CB3 | CB2 | CB1 |     |    | CA4 | CA3 | CA2 | CA1 |     |
| C1 | B6 | B5  | B4  | B3  | B2  | B1  | A6 | A5  | A4  | A3  | A2  | A1  |

In particular, Table 1 depicts two complete (3,3,3,3;6) GPCs and one partial GPC. The first GPC is depicted in the rightmost six columns containing the A* values, and the second GPC is depicted in the next six columns containing the B* values. Only the first of six columns of the third GPC, containing the C* values, is shown as the leftmost column.

FIG. 1 shows simplified schematic representations of two logic elements 101, 111 such as those described in above-incorporated U.S. Pat. No. 7,565,388 and provided in the STRATIX® V FPGA available from Altera Corporation, which have Shared Arithmetic Mode carry vectors ATSCIN and ATSCOUT which may be routed between adjacent logic elements, in addition to the ripple carry input and output CCIN and CCOUT. Such devices support ternary addition and the GPC system of the example of Table 1. As seen from Table 1, each GPC group generates four sum bits SXn (X=A, . . . , F; n=1, . . . , 4) and four carry bits CXn (X=A, . . . , F; n=1, . . . , 4) using the Shared Arithmetic Mode of each logic element, which are then added by the embedded adders 102, 112. Each GPC has six outputs Xn (X=A, . . . , F; n=1, . . . , 6)—one from each logic element, but only four of those logic elements are used for inputs.

Thus, most of the available logic of two of the six logic elements is unused, and using the logic element structure of FIG. 1 always requires two additional outputs—therefore two additional logic elements—for any number of ranks of a ternary GPC. As seen from Table 1, using GPC A as an example, it is clear that the most significant output bit (A6) is simply the carry-out generated in the logic element that generates A5 by the most significant carry vector bit (CA4) and the carry-in of CA3 from the logic element that generates A4. The A6 output bit is therefore already calculated in the logic element that generates A5, as the carry-out of the embedded 1-bit adder 102, 112.

Each logic element 101, 111 has logic stage 103, 113, embedded adder 102, 112, and an output stage 104, 114. Each logic stage 103, 113 includes two look-up tables 123, 133 and multiplexers 143, 153. Each output stage 104, 114 includes two output registers 124, 134, each having a pre-register multiplexer 144, 154. The SUMOUT signal 122 from the adder 102, 112 is routed to one of the inputs of each pre-register multiplexer 144, 154, and the LUTOUT signal 105 is routed to the other input of each pre-register multiplexer 144, 154. As indicated by the indicia "Rank(x)" and "Rank(x+1)" on the inputs 121, 131, each logic element can be used to compute one rank of a GPC.

Figure 2:
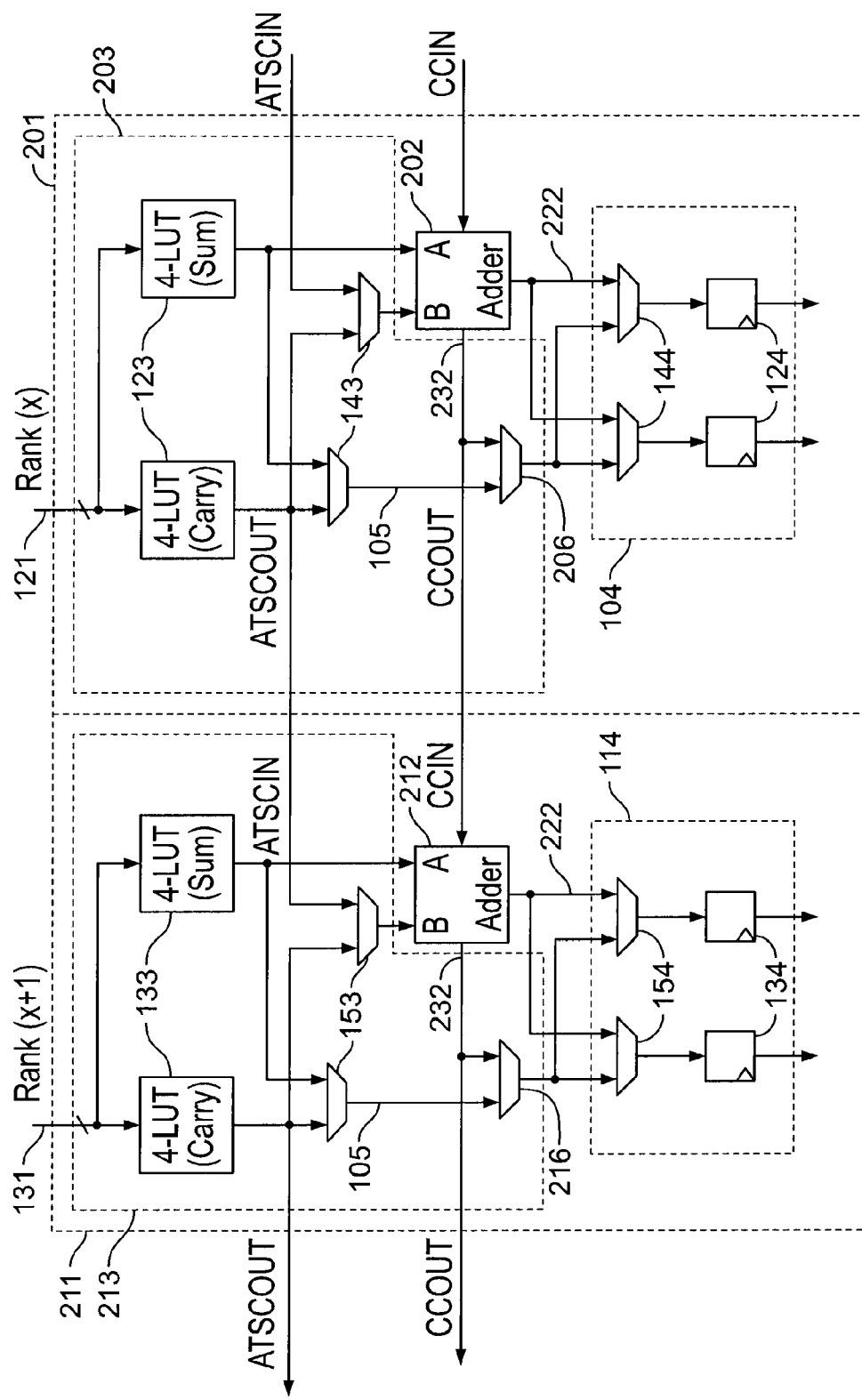
FIG. 2 shows logic element structures incorporating a first embodiment of the invention for use in a GPC implementation according to the invention.

As seen in FIG. 2 in conjunction with Table 2, below, in accordance with embodiments of the present invention, the addition of a single 2:1 multiplexer 206, 216 to the logic stage 203, 213 of a logic element 201, 211 can eliminate one of the "extra" logic elements in each GPC. This arrangement allows both the SUMOUT signal 222 and CARRYOUT signal 232 from the adder 202, 212 to be output from the same logic element, rather than carrying CARRYOUT signal 232 to the next logic element. Although FIG. 2 shows the additional multiplexer 202 at every logic element 201, 211, it could be added only to every other logic element, or even fewer. The only effect of limiting the number of logic elements including multiplexer 202 would be to restrict the placement of GPCs in the device to those particular locations where the enhanced logic elements were available for the appropriate GPC columns.

Table 2 depicts the same three GPCs (two full; one partial) as in Table 1, but implemented using logic elements 201, 211 of FIG. 2.

TABLE 2

| C* |    | B*  | B*  | B*  | B*  |     | A*  | A*  | A*  | A*  |
|----|----|-----|-----|-----|-----|-----|-----|-----|-----|-----|
| C* |    | B*  | B*  | B*  | B*  |     | A*  | A*  | A*  | A*  |
| C* |    | B*  | B*  | B*  | B*  |     | A*  | A*  | A*  | A*  |
| SC1|    | SB4 | SB3 | SB2 | SB1 |     | SA4 | SA3 | SA2 | SA1 |
|    | C4 | CB3 | CB2 | CB1 |     | CA4 | CA3 | CA2 | CA1 |     |
| C1 | B5, B6 | B4 | B3 | B2 | B1 | A6, A5 | A4 | A3 | A2 | A1 |

Because the two most significant bits of the GPC are output from a single logic element, the efficiency of the GPCs is as high as 89% (for an 8-rank GPC). Even for a smaller 2-rank GPC, the efficiency is 66% (or a 2:1 compression ratio), which is still better than the unmodified logic elements of FIG. 1. However, there is still one column which is used only for its output stage, and the logic of that column is still unused.

Figure 3:
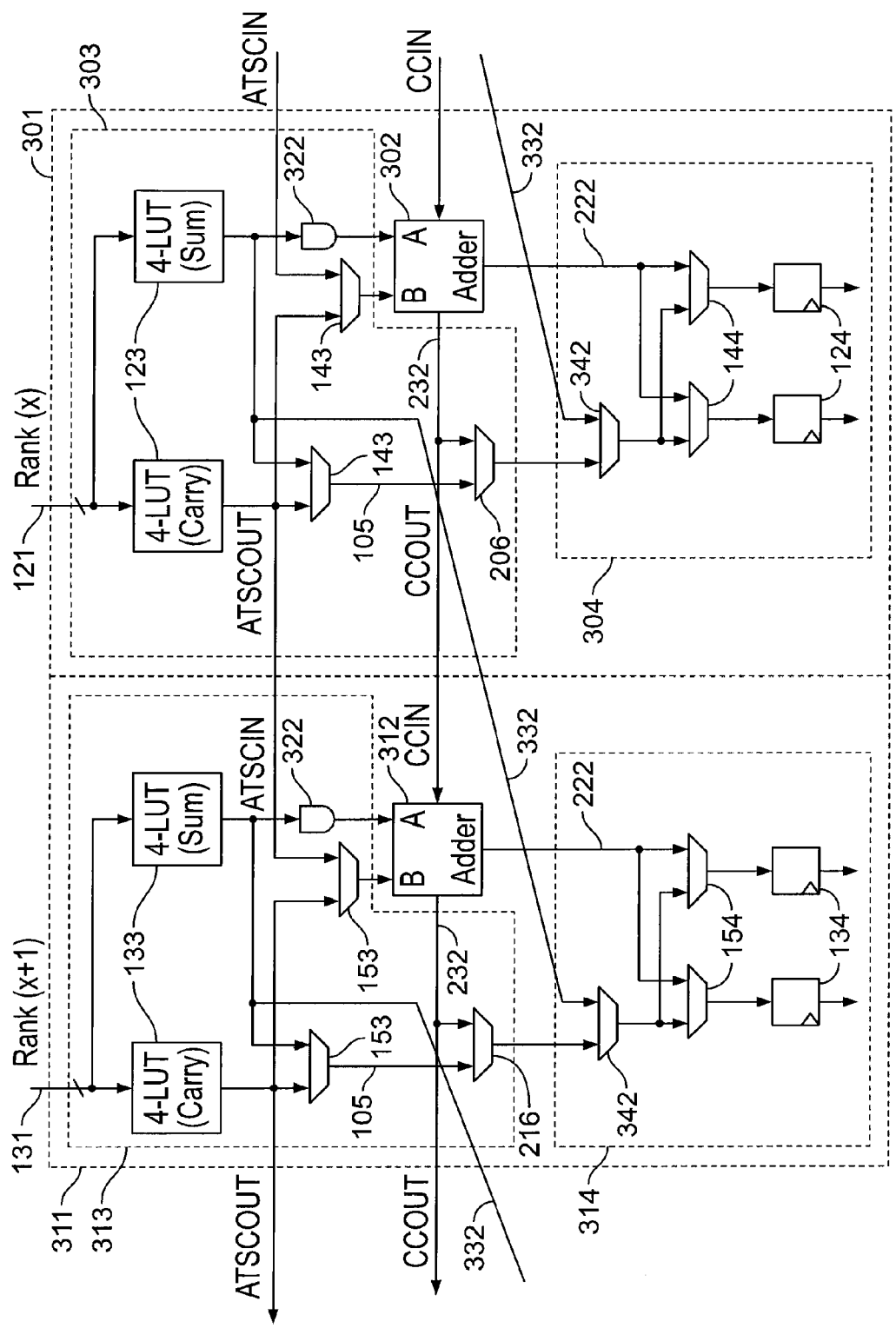
FIG. 3 shows logic element structures incorporating a second embodiment of the invention for use in a GPC implementation according to the invention

As seen in FIG. 3 in conjunction with Table 3, below, in accordance with further embodiments of the present invention, the remaining empty column is eliminated, resulting in ternary GPC implementations that can achieve 3:1 compression. The calculation of the least significant bit of each GPC is moved into the last column of the previous GPC, which was used only to output the most significant bit, but whose logic was unused in FIG. 2/Table 2.

As described previously, the X5 value is the sum of CX4 (which is generated in the previous column and forwarded to the current column), and the carry-out of the previous embedded adder 302, 312 of logic element 301, 311. The X6 value is the carry-out of the adder generating the X5 value. Therefore, the "A" input to the adder that generates both X5 and X6 is not needed, and the logic in this column can be decoupled from the embedded adder 302, 312 in this column. For example, the "A" input can be selectively zeroed by the inclusion of an AND gate 322 in logic stage 303, 313.

The (X+1)1 output—i.e., the least significant bit of the next GPC—is the sub-bit of the first column of that GPC, which can be generated in a single look-up table. Therefore, that bit can be calculated in the unused logic of the logic element that generates X5 and X6. Because both output registers 124, 134 of that logic element are used to output X5 and X6, a new connection 332 is added in logic stage 303, 313, which feeds an added 2:1 multiplexer 342 in output stage 304, 314 of the next logic element, which calculates the (X+1)2 output and outputs the (X+1)2 output using one of its output registers 124, 134. Connection 332 and multiplexer 342 allow the (X+1)1 output to be output from the other output register 124, 134 of the logic element which calculates the (X+1)2 output. Thus, the least significant two bits of the ternary GPC are output from the same logic element.

As above, FIG. 3 shows connection 332 and additional multiplexer 342, as well as AND-gate 322, at every logic element 301, 311, but again it could be added only to every other logic element, or even fewer, with the effect of restricting the placement of GPCs to particular locations. Because of the added complexity of this embodiment, the option of including AND-gate 322, connection 332, and additional multiplexer 342 at only every other logic element may be preferred.

Table 3 again depicts the same three GPCs (two full; one partial) as in Tables 1 and 2, but implemented using logic elements 301, 311 of FIG. 3.

TABLE 3

| C* | B* | B* | B* | B* | A* | A* | A* | A* |
|---|---|---|---|---|---|---|---|---|
| C* | B* | B* | B* | B* | A* | A* | A* | A* |
| C* | B* | B* | B* | B* | A* | A* | A* | A* |
| SC1 | SB4 | SB3 | SB2 | SB1 | SA4 | SA3 | SA2 | SA1 |
| C4 | CB3 | CB2 | CB1 | CA4 | CA3 | CA2 | CA1 | X |
| B5, B6 | B4 | B3 | B2, B1 | A6, A5 | A4 | A3 | A2 | A1 |

As can be seen, efficiency for this implementation is 100%.

The embodiments shown above are merely exemplary. These and other configurations in accordance with the invention can be implemented in programmable integrated circuit devices such as programmable logic devices, where programming software can be provided to allow users to configure a programmable device to perform the various operations.

Instructions for carrying out a method according to this invention for programming a programmable device to implement GPCs for ternary addition may be encoded on a machine-readable medium, to be executed by a suitable computer or similar device to implement the method of the invention for programming or configuring PLDs or other programmable devices to perform the operations as described above. For example, a personal computer may be equipped with an interface to which a PLD can be connected, and the personal computer can be used by a user to program the PLD using a suitable software tool, such as the QUARTUS® II software available from Altera Corporation, of San Jose, Calif.

Figure 4:
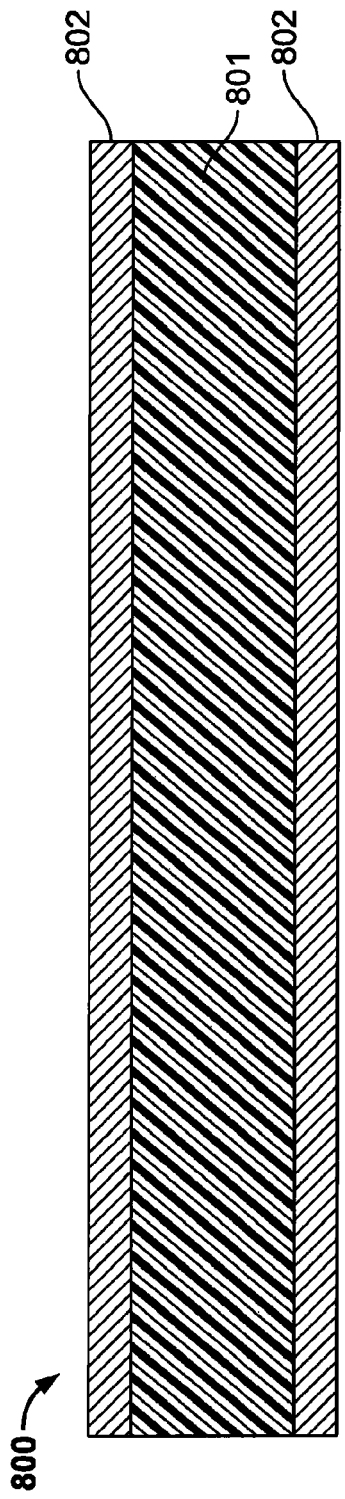
FIG. 4 is a cross-sectional view of a magnetic data storage medium encoded with a set of machine-executable instructions for performing a method according to the present invention for configuring logic as a GPC.

FIG. 4 presents a cross section of a magnetic data storage medium 800 which can be encoded with a machine executable program that can be carried out by systems such as the aforementioned personal computer, or other computer or similar device. Medium 800 can be a floppy diskette or hard disk, or magnetic tape, having a suitable substrate 801, which may be conventional, and a suitable coating 802, which may be conventional, on one or both sides, containing magnetic domains (not visible) whose polarity or orientation can be altered magnetically. Except in the case where it is magnetic tape, medium 800 may also have an opening (not shown) for receiving the spindle of a disk drive or other data storage device.

The magnetic domains of coating 802 of medium 800 are polarized or oriented so as to encode, in manner which may be conventional, a machine-executable program, for execution by a programming system such as a personal computer or other computer or similar system, having a socket or peripheral attachment into which the PLD to be programmed may be inserted, to configure appropriate portions of the PLD, including its specialized processing blocks, if any, in accordance with the invention.

Figure 5:
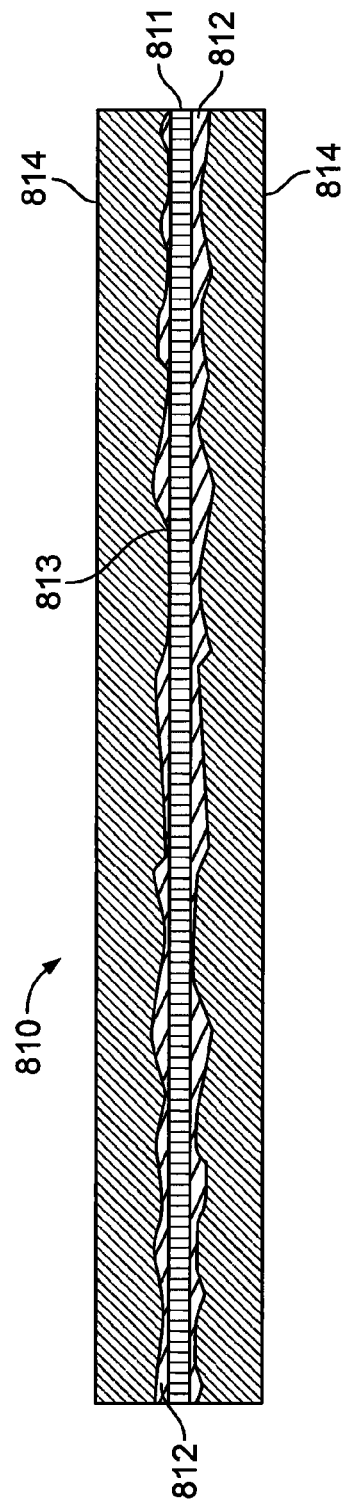
FIG. 5 is a cross-sectional view of an optically readable data storage medium encoded with a set of machine executable instructions for performing a method according to the present invention for configuring logic as a GPC.

FIG. 5 shows a cross section of an optically-readable data storage medium 810 which also can be encoded with such a machine-executable program, which can be carried out by systems such as the aforementioned personal computer, or other computer or similar device. Medium 810 can be a conventional compact disk read-only memory (CD-ROM) or digital video disk read-only memory (DVD-ROM) or a rewriteable medium such as a CD-R, CD-RW, DVD-R, DVD-RW, DVD+R, DVD+RW, or DVD-RAM or a magneto-optical disk which is optically readable and magneto-optically rewriteable. Medium 810 preferably has a suitable substrate 811, which may be conventional, and a suitable coating 812, which may be conventional, usually on one or both sides of substrate 811.

In the case of a CD-based or DVD-based medium, as is well known, coating 812 is reflective and is impressed with a plurality of pits 813, arranged on one or more layers, to encode the machine-executable program. The arrangement of pits is read by reflecting laser light off the surface of coating 812. A protective coating 814, which preferably is substantially transparent, is provided on top of coating 812.

In the case of magneto-optical disk, as is well known, coating 812 has no pits 813, but has a plurality of magnetic domains whose polarity or orientation can be changed magnetically when heated above a certain temperature, as by a laser (not shown). The orientation of the domains can be read by measuring the polarization of laser light reflected from coating 812. The arrangement of the domains encodes the program as described above.

Figure 6:
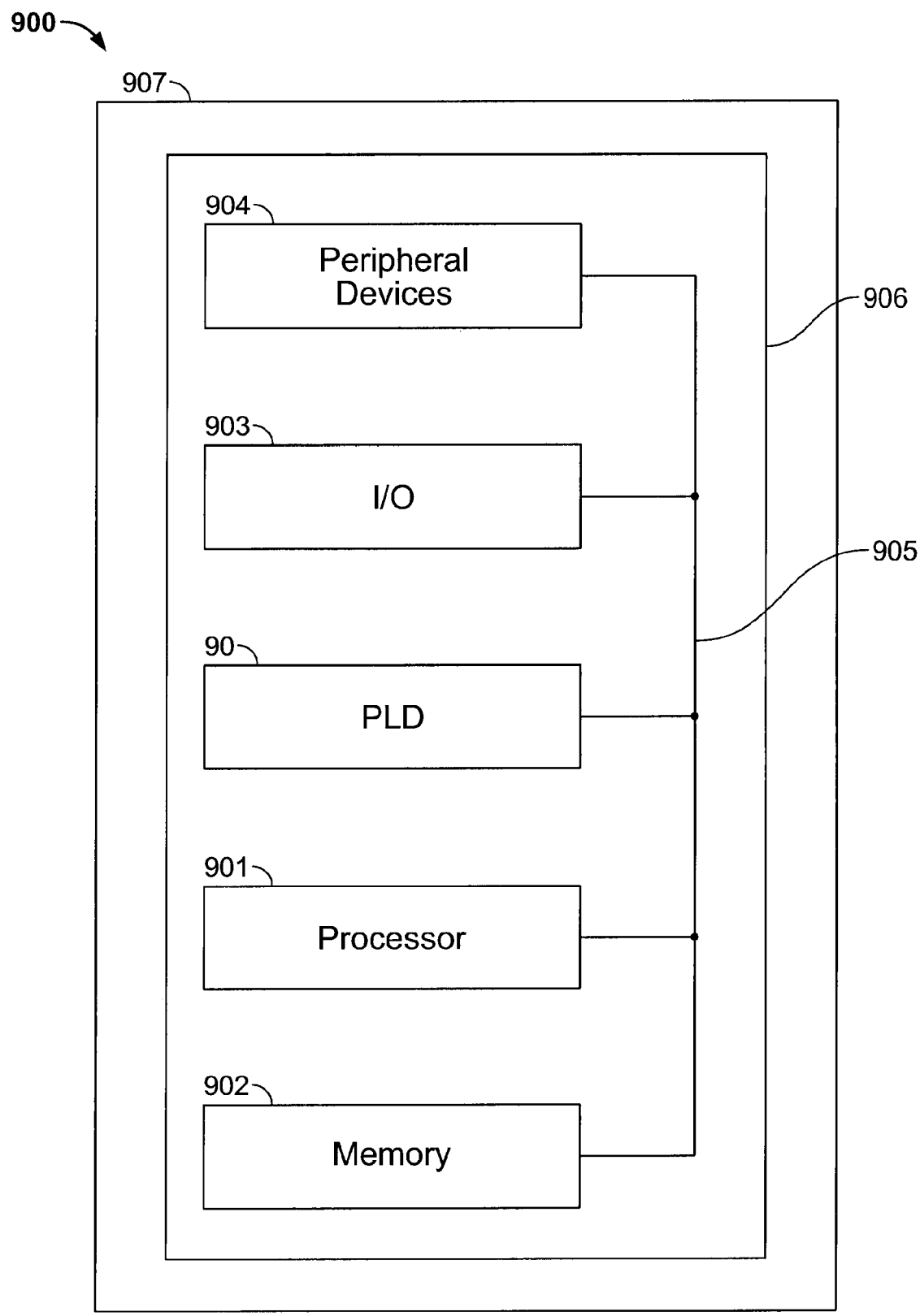
FIG. 6 is a simplified block diagram of an illustrative system employing a programmable logic device incorporating the present invention.

A PLD 90 programmed according to the present invention may be used in many kinds of electronic devices. One possible use is in a data processing system 900 shown in FIG. 6. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to a shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention. For example, the various elements of this invention can be provided on a PLD in any desired number and/or arrangement. One skilled in the art will appreciate that the present invention can be practiced by other than the described embodiments, which are presented for purposes of illustration and not of limitation, and the present invention is limited only by the claims that follow.

What is claimed is:

1. A logic element for a programmable integrated circuit device, said logic element comprising:
   a logic stage;
   an adder; and
   an output stage; wherein:
   said logic stage comprises:
   logic units, and
   a logic stage selector for selectively outputting to an input of said adder at least one of (a) outputs of said logic units, and (b) a first logic unit output of another said logic element, and for selectively outputting to said output stage one of (a) an output of said logic units, and (b) a first output of said adder; and
   said output stage comprises:
   at least two outputs, and
   an output selector for selectively outputting, to said at least two outputs, at least one of (a) a second output of said adder, and (b) an output of said logic stage selector.

2. The logic element of claim 1 wherein said logic units comprise look-up tables.

3. The logic element of claim 1 wherein each respective one of said logic stage selector and said output selector comprises at least one respective multiplexer.

4. The logic element of claim 3 wherein said logic stage selector comprises three multiplexers.

5. The logic element of claim 4 wherein:
   a first multiplexer of said logic stage selector selects between outputs of said look-up tables;
   a second multiplexer of said logic stage selector selects between an output of one of said look-up tables and said first logic unit output of said another said logic element; and
   a third multiplexer of said logic stage selector selects between an output of said first multiplexer and said first output of said adder.

6. The logic element of claim 5 wherein said first output of said adder is a sum output and said second output of said adder is a carry output.

7. The logic element of claim 5 wherein said output selector comprises:
   first and second multiplexers, each of which selects between said second output of said adder and said output of said logic stage selector; and
   a third multiplexer that selects between an output of said third multiplexer of said logic stage selector and a second logic unit output of said another said logic element.

8. The logic element of claim 7 further comprising circuitry that disconnects said logic stage from said input of said adder.

9. The logic element of claim 8 wherein said circuitry comprises an AND-gate.

10. The logic element of claim 3 wherein said output selector comprises first and second multiplexers, each of which selects between said second output of said adder and said output of said logic stage selector.

11. A programmable integrated circuit device comprising the logic element of claim 1.

12. The programmable integrated circuit device of claim 11 configured as a generalized parallel counter.

13. Multi-rank generalized parallel counter circuitry comprising:
    a respective logic element for each rank of said multi-rank generalized parallel counter circuitry, each said logic element comprising:
    a logic stage;
    an adder; and
    an output stage; wherein:
    said logic stage comprises:
    logic units, and
    a logic stage selector for selectively outputting to an input of said adder at least one of (a) outputs of said logic units, and (b) a first logic unit output of another said logic element, and for selectively outputting to said output stage one of (a) an output of said logic units, and (b) a first output of said adder; and
    said output stage comprises:
    at least two outputs, and
    an output selector for selectively outputting, to said at least two outputs, at least one of (a) a second output of said adder, and (b) an output of said logic stage selector.

14. The generalized parallel counter circuitry of claim 13 wherein said logic units comprise look-up tables.

15. The generalized parallel counter circuitry of claim 13 wherein each respective one of said logic stage selector and said output selector comprises at least one respective multiplexer.

16. The generalized parallel counter circuitry of claim 15 wherein said logic stage selector comprises three multiplexers.

17. The generalized parallel counter circuitry of claim 16 wherein:
    a first multiplexer of said logic stage selector selects between outputs of said look-up tables;
    a second multiplexer of said logic stage selector selects between an output of one of said look-up tables and said first logic unit output of said another said logic element; and
    a third multiplexer of said logic stage selector selects between an output of said first multiplexer and said first output of said adder.

18. The generalized parallel counter circuitry of claim 17 wherein said first output of said adder is a sum output and said second output of said adder is a carry output.

19. The generalized parallel counter circuitry of claim 17 wherein said output selector comprises:
    first and second multiplexers, each of which selects between said second output of said adder and said output of said logic stage selector; and
    a third multiplexer that selects between an output of said third multiplexer of said logic stage selector and a second logic unit output of said another said logic element.

20. The generalized parallel counter circuitry of claim 19 further comprising disconnect circuitry that disconnects said logic stage from said input of said adder.

21. The generalized parallel counter circuitry of claim 20 wherein said disconnect circuitry comprises an AND-gate.

22. The generalized parallel counter circuitry of claim 15 wherein said output selector comprises first and second multiplexers, each of which selects between said second output of said adder and said output of said logic stage selector.

23. A method of operating a multi-rank generalized parallel counter, said method comprising:
    receiving inputs at a rank of said multi-rank generalized parallel counter;
    performing logic functions on said inputs to provide logical outputs;

selectively adding at least one of said logical outputs and an output of another rank of said multi-rank generalized parallel counter, said output of said another rank of said multi-rank generalized parallel counter being one of (a) said logical outputs of performing said logic functions in said another rank of said multi-rank generalized parallel counter, and (b) an output of said selectively adding in said another rank of said multi-rank generalized parallel counter; and selectively outputting from among at least (a) said logical outputs, (b) a first output of said selectively adding, and (c) a second output of said selectively adding.

24. The method of claim 23, wherein said selectively outputting comprises selectively outputting from among (a) said logical outputs, (b) a first output of said selectively adding, (c) a second output of said selectively adding, and (d) said logical outputs of said another rank of said multi-rank generalized parallel counter.

25. A non-transitory machine-readable data storage medium encoded with non-transitory machine-executable instructions for configuring a programmable integrated circuit device as a multi-rank generalized parallel counter, said instructions comprising:

instructions to configure a respective logic element of said programmable integrated circuit device as each respective rank of said generalized parallel counter, each said logic element comprising:
a logic stage,
an adder, and
an output stage, wherein:
said logic stage comprises:
logic units, and
a logic stage selector for selectively outputting to an input of said adder at least one of (a) outputs of said logic units, and (b) a first logic unit output of another said logic element, and for selectively outputting to said output stage one of (a) an output of said logic units, and (b) a first output of said adder, and
said output stage comprises:
at least two outputs, and
an output selector for selectively outputting, to said at least two outputs, at least one of (a) a second output of said adder, and (b) an output of said logic stage selector; and
instructions to configure said logic stage selector to output to said output stage said first output of said adder.

26. The data storage medium of claim 25, wherein said output selector comprises, first and second multiplexers, each of which selects between said second output of said adder and said output of said logic stage selector, and a third multiplexer that selects between an output of said third multiplexer of said logic stage selector and a second logic unit output of said another said logic element; said instructions further comprising:

instructions to configure said third multiplexer to select said second logic unit output of said another said logic element.

* * * * *